(12) United States Patent
Jung

(10) Patent No.: US 10,686,023 B2
(45) Date of Patent: Jun. 16, 2020

(54) DISPLAY APPARATUS

(71) Applicant: LG Display Co., Ltd., Seoul (KR)

(72) Inventor: HaeYoon Jung, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/103,211

(22) Filed: Aug. 14, 2018

(65) Prior Publication Data

US 2019/0206959 A1 Jul. 4, 2019

(30) Foreign Application Priority Data

Dec. 29, 2017 (KR) .......................... 10-2017-0184336

(51) Int. Cl.
| | |
|---|---|
| *H01L 27/32* | (2006.01) |
| *H01L 27/12* | (2006.01) |
| *H01L 51/00* | (2006.01) |
| *H01L 51/52* | (2006.01) |

(52) U.S. Cl.
CPC ...... *H01L 27/3248* (2013.01); *H01L 27/1214* (2013.01); *H01L 27/3276* (2013.01); *H01L 51/0097* (2013.01); *H01L 51/5237* (2013.01); *H01L 51/5246* (2013.01); *G09G 2310/0264* (2013.01); *H01L 27/3244* (2013.01)

(58) Field of Classification Search
CPC ........ G09G 2310/0264; H01L 27/1214; H01L 27/3248; H01L 27/3276; H01L 51/0097; H01L 51/5237
See application file for complete search history.

(56) References Cited

U.S. PATENT DOCUMENTS

| | | | |
|---|---|---|---|
| 9,780,157 B2 * | 10/2017 | Kwon | ................. H01L 27/3276 |
| 2013/0002583 A1 | 1/2013 | Jin et al. | |
| 2014/0065430 A1 | 3/2014 | Yamazaki et al. | |
| 2014/0353670 A1 * | 12/2014 | Youn | ..................... H01L 27/124 |
| | | | 257/72 |
| 2015/0138041 A1 | 1/2015 | Hirakata et al. | |
| 2015/0137102 A1 * | 5/2015 | Yang | ..................... B32B 37/144 |
| | | | 257/40 |
| 2015/0179728 A1 | 6/2015 | Kwon et al. | |
| 2017/0033313 A1 | 2/2017 | Kim et al. | |
| 2017/0077447 A1 | 3/2017 | Kang et al. | |
| 2017/0170206 A1 * | 6/2017 | Lee | ..................... H01L 27/1218 |

(Continued)

FOREIGN PATENT DOCUMENTS

| | | |
|---|---|---|
| JP | 2003-330005 A | 11/2003 |
| JP | 2013-015836 A | 1/2013 |

(Continued)

OTHER PUBLICATIONS

Notice of Reasons for Refusal dated Jan. 23, 2020, issued in corresponding Japanese Patent Application No. 2018-232083.

*Primary Examiner* — Mohammed Shamsuzzaman
(74) *Attorney, Agent, or Firm* — Morgan, Lewis & Bockius LLP

(57) ABSTRACT

A display device includes a first substrate, a pixel array layer on the first substrate, a second substrate on the pixel array layer, and a cover layer surrounding a side of the second substrate. Furthermore, the display device includes an active area and a non-active area. The second substrate is in the active area, and the cover layer is in the non-active area. The cover layer has different thicknesses to define a step.

14 Claims, 3 Drawing Sheets

(56) References Cited

U.S. PATENT DOCUMENTS

| | | | |
|---|---|---|---|
| 2017/0288005 A1 | 10/2017 | Kawata | |
| 2017/0343877 A1* | 11/2017 | Kim | G02F 1/1345 |
| 2018/0123060 A1* | 5/2018 | Jang | H01L 27/3276 |
| 2018/0259805 A1* | 9/2018 | Takehara | G02F 1/133305 |
| 2018/0321764 A1* | 11/2018 | Oh | G06F 3/044 |
| 2019/0033652 A1* | 1/2019 | Sano | G02F 1/133305 |
| 2019/0067411 A1* | 2/2019 | Lee | H01L 27/3293 |

FOREIGN PATENT DOCUMENTS

| | | |
|---|---|---|
| JP | 2015-118373 A | 6/2015 |
| JP | 2017-111435 A | 6/2017 |
| JP | 2017-126081 A | 7/2017 |
| JP | 2017-187580 A | 10/2017 |
| KR | 10-2017-0014807 A | 2/2017 |
| KR | 10-2017-0032955 A | 3/2017 |

* cited by examiner

DISPLAY APPARATUS

CROSS-REFERENCE TO RELATED APPLICATIONS

This application claims the benefit of the Korean Patent Application No. 10-2017-0184336, filed on Dec. 29, 2017, which is hereby incorporated by reference as if fully set forth herein.

BACKGROUND

Technical Field

The present disclosure relates to a display apparatus.

Discussion of the Related Art

With the advancement of information-oriented society, various requirements for display apparatuses that display an image are increasing. Recently, slimmer display apparatuses are being realized. Flexible display apparatuses, which are easy to carry, may be applied to various display apparatuses.

Flexible display apparatuses may each include a bending part that is bent and enables a substrate to be folded. Because the substrate is folded by using the bending part, a bezel size is reduced, and thus, display apparatuses having a narrow bezel may be implemented.

However, as a degree of bending increases for realizing a narrower bezel, an inorganic layer included in a bending area may be broken due to being vulnerable to stress as an outermost stress increases, and as an internal stress of a panel is strengthened. For this reason, a light emitting device layer may peel, and a thin film transistor may be short-circuited.

The above-described background is possessed by the inventor of the application for deriving the disclosure, or is technology information that has been acquired in deriving the disclosure. The above-described background is not necessarily known technology disclosed to the general public before the application of the disclosure.

SUMMARY

Accordingly, the present disclosure is directed to a display apparatus that substantially obviates one or more problems due to limitations and disadvantages of the related art.

An object of the present disclosure is to provide a display apparatus in which bending is easily performed, thereby realizing a zero bezel.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the disclosure, as embodied and broadly described herein, there is provided a display device, comprising a first substrate; a pixel array layer on the first substrate; a second substrate on the pixel array layer; and a cover layer surrounding a side of the second substrate, wherein the display device includes an active area and a non-active area, the second substrate is in the active area, and the cover layer is in the non-active area; and wherein the cover layer has different thicknesses to define a step.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION OF THE DISCLOSURE

Figure 1:
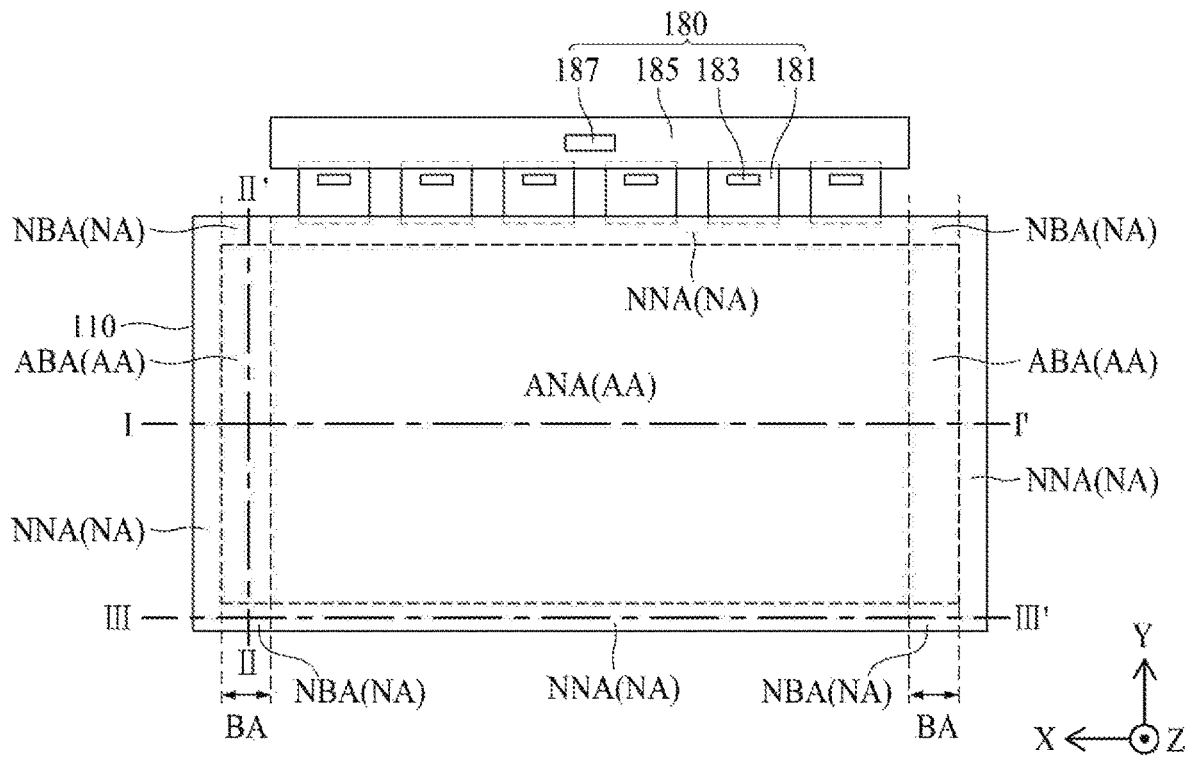
FIG. 1 is a plan view of a display apparatus according to an embodiment of the present disclosure.

Reference will now be made in detail to the embodiments of the present disclosure, examples of which are illustrated in the accompanying drawings.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on~," "over~," "under~," and "next~," one or more other parts may be disposed between the two parts unless "just" or "direct" is used.

In describing a time relationship, for example, when the temporal order is described as "after~," "subsequent~,"

"next~," and "before~," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
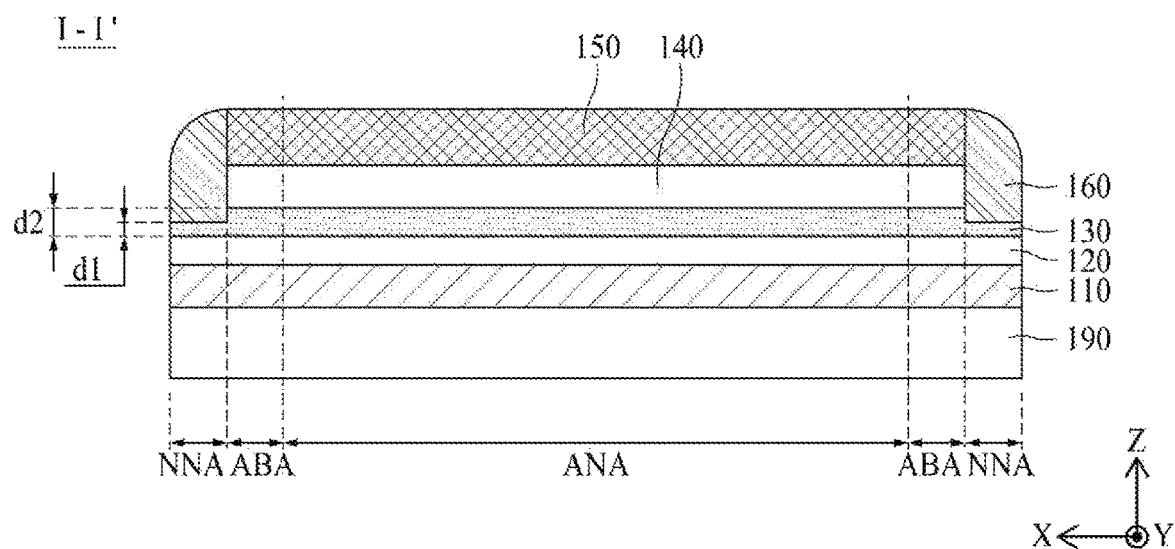
FIG. 2 is a cross-sectional view taken along line I-I' illustrated in FIG. 1.
Figure 3:
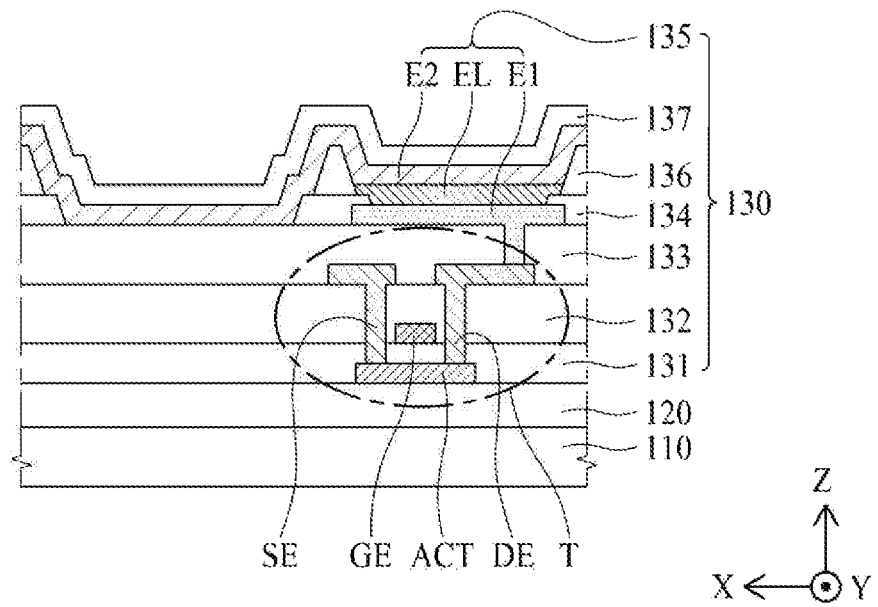
FIG. 3 is a cross-sectional view for describing a pixel array layer of FIG. 2.

FIG. 1 is a plan view of a display apparatus according to an embodiment of the present disclosure. FIG. 2 is a cross-sectional view taken along line I-I' illustrated in FIG. 1. FIG. 3 is a cross-sectional view for describing a pixel array layer of FIG. 2.

With reference to FIGS. 1 to 3, the display apparatus according to the present embodiment may include a first substrate 110, a pixel array layer 130, a second substrate 150, and a cover layer 160.

The first substrate 110, a base substrate, may be a flexible substrate. For example, the first substrate 110 may include a transparent polyimide material. The first substrate 110 including the transparent polyimide material may be formed by curing a polyimide resin that is coated to have a certain thickness on a front surface of a release layer provided on a carrier glass substrate. In this case, the carrier glass substrate may be separated from the first substrate 110 by releasing the release layer through a laser release process.

The first substrate 110 may include an active area AA, a non-active area NA, and a bending area BA.

The active area AA may be a display area that displays an image, and may be defined in a center portion of the first substrate 110.

The non-active area NA may be a non-display area that does not display an image, and may be defined in an edge of the first substrate 110 to surround the active area AA.

The bending area BA may be defined as a part that is bent in a curve shape.

The bending area BA according to an embodiment may include an area that overlaps the active area AA and the non-active area NA. An area where the bending area BA overlaps the active area AA may be an area where an active bending area ABA, the bending area BA, and the non-active area NA overlap one another, and for example, may be referred as a non-active bending area NBA.

Therefore, the active area AA may include the active bending area ABA and an active non-bending area ANA corresponding to an area other than the active bending area ABA. The non-active area NA may include a non-active bending area NBA and a non-active non-bending area NNA corresponding to an area other than the non-active bending area NBA.

Here, the active bending area ABA may be an edge display area that displays an image on a side surface of the display apparatus, and the active non-bending area ANA may be a front display area that displays an image on a front surface of the display apparatus.

A buffer layer 120 may be provided on the first substrate 110. The buffer layer 120 may be provided on a top of the first substrate 110, for preventing water from penetrating into the active area AA via the first substrate 110. The buffer layer 120 according to an embodiment may be formed of a plurality of inorganic layers that are alternately stacked. For example, the buffer layer 120 may be a multilayer where one or more inorganic layers of silicon oxide (SiOx), silicon nitride (SiNx), and silicon oxynitride (SiON) are alternately stacked.

The pixel array layer 130 may be provided on the buffer layer 120. The pixel array layer 130 according to an embodiment may include a plurality of gate lines, a plurality of data lines, a plurality of driving power lines, a thin film transistor (TFT) T, a bank 134, an organic light emitting layer 135, a partition wall 136, and an encapsulation layer 137.

The gate lines may be provided on a gate insulating layer 131, arranged in parallel along a first direction X, and spaced apart from one another along a second direction Y. The gate lines may be covered by an interlayer insulating layer 132.

The data lines may be provided on the interlayer insulating layer 132, arranged in parallel along the second direction Y, and spaced apart from one another along the first direction X.

The driving power lines may be provided on the interlayer insulating layer 132 in parallel with the data lines.

The TFT T may be provided on the buffer layer 120. For example, the TFT T may be provided on the buffer layer 120 in an area overlapping the active area AA. The TFT T may include an active layer ACT provided on the buffer layer 120, the gate insulating layer 131 provided on the active layer ACT, a gate electrode GE provided on the gate insulating layer 131, the interlayer insulating layer 132 provided on the gate electrode GE, and a source electrode SE and a drain electrode DE that are provided on the interlayer insulating layer 132 and connected to the active layer ACT. The source electrode SE and the drain electrode DE may be covered by a passivation layer 133. In FIG. 3, it is illustrated that the TFT T is provided as a top gate type, but the present embodiment is not limited thereto. In other embodiments, the TFT T may be provided as a bottom gate type where the gate electrode GE is disposed under the active layer ACT. The TFT T may allow the organic light emitting layer 135 to emit light according to a gate signal supplied through an adjacent gate line, a driving power supplied through an adjacent driving power line, and a data signal supplied through an adjacent data line.

The bank 134 may define an emissive area and may be referred to as a pixel defining layer. The bank 134 may be provided on the passivation layer 133 and an edge of a first electrode E1 to define the emissive area. For example, the bank 134 may include one organic material of acryl resin, epoxy resin, phenolic resin, polyamide resin, polyimide resin, benzocyclobutene resin, and fluorine resin. As another example, the bank 134 may be formed of a photosensitive material including a black pigment, and in this case, the bank 134 may act as a light blocking pattern.

The organic light emitting layer 135 may be provided on the TFT T. The organic light emitting layer 135 may include the first electrode E1, a light emitting layer EL, and a second electrode E2.

The first electrode E1 may be provided on the TFT T and may be referred to as an anode electrode. The first electrode E1 may be electrically connected to the TFT T through a contact hole provided in the passivation layer 133.

The light emitting layer EL may be provided on the first electrode E1. The light emitting layer EL may include two or more light emitting parts for emitting white light. For example, the light emitting layer EL may include a first light emitting part and a second light emitting part for emitting the white light based on a combination of first light and second light. Here, the first light emitting part may emit the first light and may include one of a blue light emitting layer, a green light emitting layer, a red light emitting layer, a yellow light emitting layer, and a yellow-green light emitting layer. The second light emitting part may include a light emitting layer emitting light having a complementary color relationship of the first light among a blue light emitting layer, a green light emitting layer, a red light emitting layer, a yellow light emitting layer, and a yellow-green emitting layer.

The second electrode E2 may be provided to cover the light emitting layer EL and may be referred to as a cathode electrode.

The partition wall 136 may be provided on the bank 134. The partition wall 140 may isolate the light emitting layer EL provided in an area overlapping the emissive area. For example, the partition wall 136 may include one organic material of acryl resin, epoxy resin, phenolic resin, polyamide resin, polyimide resin, benzocyclobutene resin, and fluorine resin.

The encapsulation layer 137 may be provided to cover the second electrode E2. The encapsulation layer 137 according to an embodiment prevents water or oxygen from penetrating into the light emitting layer EL. The passivation layer 150 according to an embodiment may include at least one inorganic material of silicon oxide (SiOx), silicon oxynitride (SiNx), silicon oxynitride (SiON), titanium oxide (TiOx), and aluminum oxide (AlOx).

Optionally, the encapsulation layer 137 may further include at least one organic layer. The organic layer may be formed to have a sufficient thickness for preventing particles from penetrating into a light emitting device layer via the encapsulation layer 137. The organic layer according to an embodiment may include one organic material of acryl resin, epoxy resin, phenolic resin, polyamide resin, polyimide resin, benzocyclobutene resin, and fluorine resin.

The pixel array layer 130 according to an embodiment may include a plurality of inorganic layers. For example, the pixel array layer 130 may include the plurality of inorganic layers that include the gate insulating layer 131, the interlayer insulating layer 132, and the passivation layer 133. Each of the gate insulating layer 131, the interlayer insulating layer 132, and the passivation layer 133 may be formed of an inorganic material and may be provided to extend lengthwise in an entire area of the first substrate, other than the non-active bending area NBA. Likewise, the buffer layer 120 may be provided to extend lengthwise in the same area as the plurality of inorganic layers.

As described above, the buffer layer 120, the gate insulating layer 131, the interlayer insulating layer 132, and the passivation layer 133 may not be provided in the non-active bending area NBA, thereby solving a problem where because an internal stress of a panel is strengthened in bending, the light emitting device layer is peeled, and the TFT is short-circuited.

As illustrated in FIG. 2, the pixel array layer 130 may be provided to have different thicknesses in the active area AA and the non-active area NA. For example, the pixel array layer 130 may have a second thickness d2 in the active area AA and may have a first thickness d1 in the non-active area NA, where d2 is greater than d1. This thickness difference may occur because the TFT T and the organic light emitting layer 135 of the pixel array layer 130 are provided in only the active area AA, and only the plurality of inorganic layers are provided in the non-active area NA.

The second substrate 150 may be disposed on the pixel array layer 130 and may include a first surface adjacent to the pixel array layer 130 and a second surface opposite to the first surface. The first surface of the second substrate 150 may be attached on the pixel array layer 130. The second substrate 150 may primarily prevent oxygen or water from penetrating into the light emitting device layer.

The second substrate 150 according to an embodiment may be a metal foil, a metal sheet, or a metal plate, which is formed of an opaque metal material. For example, the second substrate 150 may be formed of an alloy of iron (Fe) and nickel (Ni) having a low thermal expansion coefficient, but is not limited thereto.

The first surface of the second substrate 150 may be attached on the pixel array layer 130 by an adhesive layer 140. The adhesive layer 140 may be a thermocurable adhesive, a naturally curable adhesive, or the like. For example, the adhesive layer 140 may be formed of a material such as a pressure sensitive adhesive or a barrier pressure sensitive adhesive having a moisture absorbing function.

The cover layer 160 may be provided in the non-active area NA of the first substrate 110 to cover a side surface of the second substrate 150. The cover layer 160 may include a polymer material, and for example, may be formed of urethane, acryl, or/and the like. The cover layer 160 according to an embodiment may be provided higher in height than the adhesive layer 140 in the non-active area NA contacting the active area AA of the first substrate 110 and may prevent penetration of water passing through the adhesive layer 140.

The cover layer 160 according to an embodiment may be provided to contact the second substrate 150 at an outer portion of the active area AA, in order for a side surface of the light emitting device layer not to be exposed through the adhesive layer 140.

The cover layer 160 according to an embodiment may be provided for preventing the first substrate 110 from being rolled while the carrier glass substrate is separated from the first substrate 110 by releasing the release layer through the laser release process. In detail, the second substrate 150 may not be provided in the non-active area NA of the first substrate 110, and for this reason, the first substrate 110— which is flexible and has a thin thickness— may be rolled. The cover layer 160 may be provided in the non-active area NA of the first substrate 110 to prevent the first substrate 110 from being rolled, and a lamination process of forming a light-transmitting film 190 for supporting the first substrate 110 may be easily performed.

The cover layer 160 may be provided to have a step height. A detailed structure of the cover layer 160 will be described below.

Additionally, the display apparatus according to the present disclosure may further include a display driving circuit unit 180.

The display driving circuit unit 180 may be connected to a pad part provided in an upper non-active area NA of the first substrate 110 and may display an image corresponding to video data supplied from a display driving system. The display driving circuit unit 180 according to an embodiment may include a plurality of flexible circuit films 181, a plurality of data driving integrated circuits (ICs) 183, a printed circuit board (PCB) 185, and a timing controller 187.

Input terminals provided on one side of each of the plurality of flexible circuit films 181 may be attached on the PCB 185 through a film attachment process, and output terminals provided on the other side of each of the plurality of flexible circuit films 181 may be attached on the pad part provided on the first substrate 110 through the film attachment process.

Each of the plurality of data driving ICs 183 may be individually mounted on a corresponding flexible circuit film of the plurality of flexible circuit films 181. Each of the plurality of data driving ICs 183 may receive pixel data and a data control signal supplied from the timing controller 187 and may convert the pixel data into a pixel-based analog data signal according to the data control signal to supply the analog data signal to a corresponding data line.

The PCB 185 may support the timing controller 187 and may transfer signals and power between the elements of the display driving circuit unit 180.

The timing controller 187 may be mounted on the PCB 185 and may receive the video data and a timing synchronization signal supplied from the display driving system through a user connector provided on the PCB 185. The timing controller 187 may align the video data based on the timing synchronization signal to generate pixel data suitable for a pixel arrangement structure of the pixel array layer 130 and may supply the generated pixel data to a corresponding data driving IC 183. Also, the timing controller 187 may generate the data control signal and a scan control signal according to the timing synchronization signal, control a driving timing of each of the plurality of data driving ICs 183 by using the data control signal, and control a driving timing of the scan driving circuit 140 by using the scan control signal. Here, the scan control signal may be supplied to a first or last flexible circuit film of the plurality of flexible circuit films 181 and may be supplied to the scan driving circuit 140 through the non-active area NA of the first substrate 110.

Additionally, the display apparatus according to the present disclosure may further include the light-transmitting film 190 that is attached on the first substrate 110 to overlap the first substrate 110.

The light-transmitting film 190 may be attached on the second surface opposite to the first surface on which the buffer layer 120 is provided on the first substrate 110, by using a transparent adhesive layer, and thus, an area other than the bending area BA may be maintained in a planar state. The light-transmitting film 190 according to an embodiment may be formed of a flexible film, and for example, may be one of a polyethylene terephthalate film, an anti-reflection film, a polarizing film, and a transmittance controllable film. The light-transmitting film 190 may be attached on the second surface, separated from the carrier glass substrate, of the first substrate 110. The transparent adhesive layer may be an optically clear resin (OCR), an optically clear adhesive (OCA), or the like.

Figure 4:
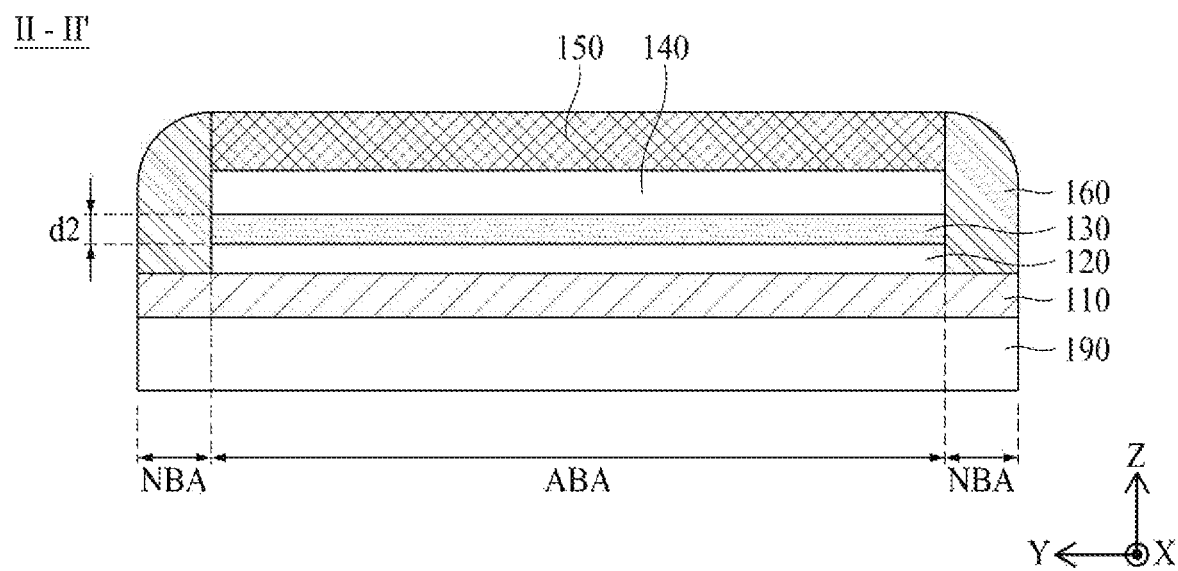
FIG. 4 is a cross-sectional view taken along line II-II' illustrated in FIG. 1.

FIG. 4 is a cross-sectional view taken along line II-II' illustrated in FIG. 1. Hereinafter, overlapping descriptions of the same elements are omitted.

With reference to FIG. 4, the cover layer 160 may be provided in the non-active bending area NBA to directly contact the first substrate 110. That is, because the plurality of inorganic layers included in the pixel array layer 130 and the buffer layer 120 are not provided in the non-active bending area NBA, the cover layer 160 may directly contact the first substrate 110.

As described above, because the buffer layer 120 and the plurality of inorganic layers are not provided in the non-active bending area NBA, a peeling defect of the organic light emitting layer 135 or a short circuit defect of the TFT T is prevented in bending. For example, because the cover layer 160 is provided in the non-active area NA that is an outermost portion, a large stress may be applied to a lower portion of the cover layer 160 in bending, in comparison with a lower portion of the second substrate 150 provided in the active area AA. In an example, because a maximum stress in the active area AA is 0.35% and a maximum stress in an area where the cover layer 160 is provided is 7.38%, it may be considered that a probability that damage occurs in the area where the cover layer 160 is provided is 21 times higher than a probability that damage occurs in the active area AA. Also, because a separate adhesive layer is not provided in the lower portion of the cover layer 160, an effect where an adhesive layer absorbs a stress is removed, and for this reason, a stress applied to the lower portion of the cover layer 160 may be very large. Also, each of the buffer layer 120 and the plurality of inorganic layers may be formed of an inorganic material that is easily broken, and for this reason, when the buffer layer 120 and the plurality of inorganic layers are disposed under the cover layer 160, a very large stress is applied, whereby the buffer layer 120 and the plurality of inorganic layers may be broken.

When a crack occurs due to a stress applied to the buffer layer 120 and the plurality of inorganic layers, the crack may be transferred to the TFT T and the organic light emitting layer 135 in the active area AA through the buffer layer 120 and the plurality of inorganic layers, causing a short circuit defect of the TFT or a peeling defect of the light emitting layer EL.

In the display apparatus according to an embodiment of the present disclosure, because the buffer layer 120 and the plurality of inorganic layers are not provided in the non-active bending area NBA, the occurrence of the above-described defects may be prevented. Here, the buffer layer 120 and the plurality of inorganic layers may be removed from the non-active bending area NBA through an etching process. In this case, the etching process may be performed along with an etching process of forming a contact hole in each of the interlayer insulating layer 132 and the passivation layer 133, and thus, patterning may be performed without a separate mask and an additional process is not needed. In the display apparatus according to the present disclosure, a problem where a crack occurs and propagates in bending is solved, and thus, the quality and reliability of the display apparatus are enhanced.

Figure 5:
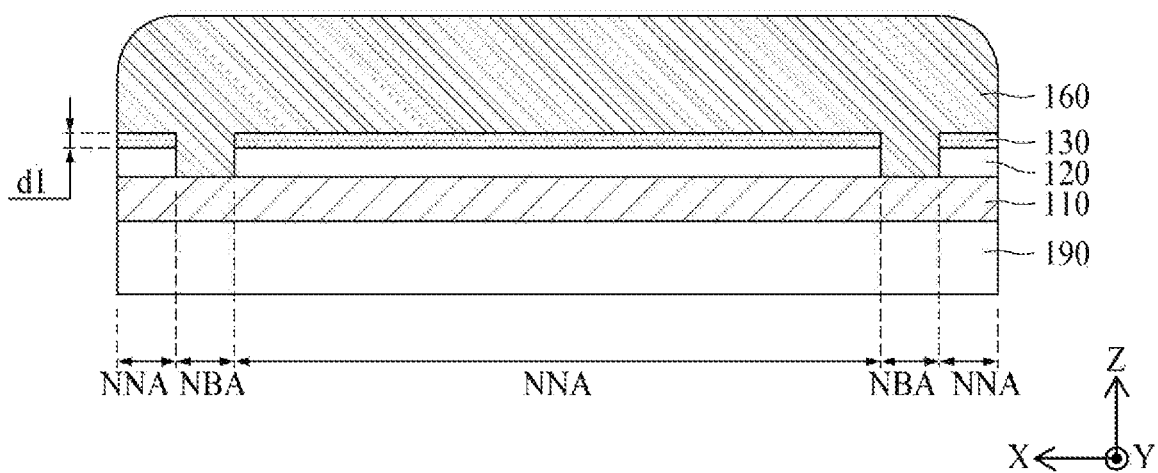
FIG. 5 is a cross-sectional view taken along line III-III' illustrated in FIG. 1.

FIG. 5 is a cross-sectional view taken along line III-III' illustrated in FIG. 1. Hereinafter, overlapping descriptions of the same elements are omitted.

With reference to FIG. 5, the cover layer 160 may be provided to have a step height. That is, as described above, the cover layer 160 may directly contact the first substrate 110 in the non-active bending area NBA and may directly contact the plurality of inorganic layers in the non-active non-bending area NNA. Here, the cover layer 160 may directly contact the passivation layer 133 disposed in an uppermost portion of the plurality of inorganic layers in the non-active non-bending area NNA.

The cover layer 160 according to an embodiment may be provided to have different thicknesses in the non-active bending area NBA and the non-active non-bending area NNA. For example, a thickness of the cover layer 160 may be set to be thicker in the non-active bending area NBA than the non-active non-bending area NNA. Such a thickness difference (e.g., a step height) may occur because the cover layer 160 directly contacts the first substrate 110 in the non-active bending area NBA and directly contacts the passivation layer 133 in the non-active non-bending area NNA.

As illustrated in FIG. 5, a pixel array layer 130 may have a first thickness d1. On the other hand, the pixel array layer 130 illustrated in FIG. 4 may have the second thickness d2. As described above, because a thickness of the pixel array layer 130 is set to be thicker in the active area AA than the non-active non-bending area NNA, an example where the pixel array layer 130 has different thicknesses is illustrated in FIGS. 4 and 5.

As described above, because the buffer layer 120 and the plurality of inorganic layers are not provided in the non-active bending area NBA, a peeling defect of the organic light emitting layer 135 or a short circuit defect of the TFT T is prevented in bending. Also, because the buffer layer 120 and the plurality of inorganic layers are not provided in the non-active bending area NBA, the cover layer 160 may be provided to have the step height. The cover layer 160 may be provided to directly contact the first substrate 110 in the non-active bending area NBA. Also, the first substrate 110 provided under the cover layer 160 may correspond to a material where a crack does not easily occur, and thus, even when a large stress is applied to the lower portion of the cover layer 160, a crack does not occur, thereby preventing a defect caused by a crack.

Moreover, in the display apparatus according to an embodiment of the present disclosure, because the buffer layer 120 and the plurality of inorganic layers are not provided in the non-active bending area NBA, a problem where a crack occurs and propagates in bending may be solved, and thus, the quality and reliability of the display apparatus are enhanced.

As described above, in the display apparatus according to the embodiments of the present disclosure, the occurrence and propagation of a crack may be prevented when bending is being performed, and thus, the quality and reliability of the display apparatus are enhanced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device, comprising:
a first substrate;
a pixel array layer on the first substrate;
a second substrate on the pixel array layer; and
a cover layer surrounding a side of the second substrate,
wherein the display device includes an active area and a non-active area, the second substrate is in the active area, and the cover layer is in the non-active area;
wherein the display device includes a bending area that overlaps the active area and the non-active area to define a respective active bending area and a non-active bending area; and
wherein a thickness of the cover layer in the non-active bending area is greater than a thickness of the cover layer in a non-active non-bending area to define a step.

2. The display device of claim 1, wherein:
the pixel array layer has a greater thickness in the active area than in the non-active area.

3. The display device of claim 2, wherein:
the pixel array layer in the active area includes an organic light emitting layer, and the pixel array layer in the non-active area does not include the organic light emitting layer.

4. The display device of claim 1, wherein:
the pixel array layer is not included at a portion of the cover layer that has a greatest thickness and that directly contacts the first substrate.

5. The display device of claim 1, wherein:
the cover layer contacts a side surface of the second substrate.

6. The display device of claim 1, wherein:
the cover layer includes a polymer material.

7. The display device of claim 1, wherein:
the first substrate is a flexible substrate and includes a transparent polyimide material.

8. The display device of claim 1, wherein:
the cover layer directly contacts the first substrate in the non-active bending area.

9. The display device of claim 1, further comprising:
a buffer layer between the pixel array layer and the first substrate.

10. The display device of claim 8, wherein:
the pixel array layer includes a plurality of inorganic layers; and
the cover layer directly contacts the plurality of inorganic layers in the non-active non-bending area.

11. The display device of claim 8, further comprising:
a buffer layer between the pixel array layer and the first substrate, wherein
the pixel array layer includes a plurality of inorganic layers; and
the buffer layer and the plurality of inorganic layers are provided on an entirety of the first substrate other than in the non-active bending area.

12. The display device of claim 10, wherein:
the plurality of inorganic layers includes a gate insulating layer, an interlayer insulating layer, and a passivation layer each on an entirety of the first substrate other than in the non-active bending area.

13. The display device of claim 12, wherein the cover layer directly contacts the passivation layer of the plurality of inorganic layers in the non-active non-bending area.

14. The display device of claim 1, wherein the active area includes an active non-bending area, and the active non-bending area is surrounded by the non-active non-bending area and the active bending area.

* * * * *